United States Patent
Hirotsuru et al.

(10) Patent No.: US 8,025,962 B2
(45) Date of Patent: Sep. 27, 2011

(54) ALUMINUM-SILICON CARBIDE COMPOSITE AND HEAT DISSIPATION DEVICE EMPLOYING THE SAME

(75) Inventors: Hideki Hirotsuru, Omuta (JP); Goh Iwamoto, Omuta (JP); Hideo Tsukamoto, Omuta (JP); Akira Miyai, Omuta (JP); Yoshio Sasaki, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 600 days.

(21) Appl. No.: 12/095,005

(22) PCT Filed: Nov. 13, 2006

(86) PCT No.: PCT/JP2006/322592
§ 371 (c)(1), (2), (4) Date: May 27, 2008

(87) PCT Pub. No.: WO2007/080701
PCT Pub. Date: Jul. 19, 2007

(65) Prior Publication Data
US 2009/0280351 A1 Nov. 12, 2009

(30) Foreign Application Priority Data
Jan. 13, 2006 (JP) .................................. 2006-005475

(51) Int. Cl.
*B32B 3/26* (2006.01)
*B32B 15/00* (2006.01)

(52) U.S. Cl. ..................... 428/307.7; 428/613; 428/650; 428/596; 428/600; 428/687; 428/312.6; 428/313.9; 428/213; 428/216; 428/220; 428/698; 428/446

(58) Field of Classification Search .................... None
See application file for complete search history.

(56) References Cited

U.S. PATENT DOCUMENTS
6,447,894 B1 * 9/2002 Hirotsuru et al. .......... 428/307.7

FOREIGN PATENT DOCUMENTS
| JP | 3022925 | 1/2000 |
| JP | 2000 281468 | 10/2000 |
| JP | 2003 204022 | 7/2003 |
| JP | 2004 55761 | 2/2004 |

OTHER PUBLICATIONS
U.S. Appl. No. 12/298,598, filed Oct. 27, 2008, Hirotsuru, et al.

* cited by examiner

*Primary Examiner* — Ling Xu
(74) *Attorney, Agent, or Firm* — Oblon, Spivak, McClelland, Maier & Neustadt, L.L.P.

(57) ABSTRACT

An aluminum-silicon carbide composite suitable for a base plate for power module, having an aluminum-silicon carbide composite, with a front and a rear surface plane, that is a flat plate-shaped silicon carbide porous body impregnated with a metal mainly containing aluminum, and an aluminum layer made of a metal mainly containing aluminum formed only on the front surface plane, wherein the rear surface plane of the composite is exposed to the outside, and the shape of the exposed aluminum-silicon carbide composite is rectangular, optionally having peripheral portions encompassing holes removed. Plating is imparted to the composite by providing an aluminum layer on the rear surface plane. Flatness of the composite is improved by grinding its rear surface so that the composite is exposed to the outside. Warpage after grinding the rear surface, is controlled by controlling the thickness of the aluminum layer.

18 Claims, 3 Drawing Sheets

A-A' section

A-A' section

A-A' section

ALUMINUM-SILICON CARBIDE COMPOSITE AND HEAT DISSIPATION DEVICE EMPLOYING THE SAME

TECHNICAL FIELD

The present invention relates to an aluminum-silicon carbide composite suitable as a base plate for power module and a heat dissipation device employing the same.

BACKGROUND ART

In recent years, along with progress of high-integration and downsizing of semiconductor elements, heat generation amount at a time of using such semiconductor element simply increases, and efficient dissipation of such heat has become a problem to be solved. For this purpose, as a circuit substrate for power module, a circuit substrate is used, which comprises a ceramic substrate such as an aluminum nitride substrate or a silicon nitride substrate having high insulation property and high thermal conductivity, a metal circuit made of copper or aluminum formed on the ceramic substrate, and a metal heat dissipation plate made of copper or aluminum formed on the rear surface of the substrate.

A typical heat dissipation structure of conventional circuit substrate is that a base plate is soldered to a rear surface (heat dissipation surface) of a circuit substrate via a metal plate such as a copper plate, and such a base plate is made of copper. However, in this structure, there has been a problem that when a heat load is applied to a semiconductor device, a crack of solder layer due to the difference of thermal expansion coefficient between the base plate and the circuit substrate occurs, and as a result, heat dissipation becomes insufficient to cause malfunction or destruction of a semiconductor element.

To cope with such a problem, an aluminum alloy-silicon carbide composite is proposed, which has a thermal expansion coefficient close to that of a circuit substrate (Patent Document 1). However, Patent Document 1 does not describe as to the shape, particularly, a warped shape of the aluminum alloy-silicon carbide composite, and accordingly, when it is actually used as a base plate for power module, there is a case that sufficient heat dissipation property is not obtained.

A base plate is used as it is joined with a heat-dissipation fin in most cases, and the shape and warpage of the joined portion are also important properties. For example, when a base plate is joined with a heat-dissipation fin, usually a heat-dissipation grease having high thermal conductivity is applied to portions to be joined, and the base plate is fixed to e.g. a heat-dissipation fin or a heat-dissipation unit by screws through holes provided in the peripheral portion of the base plate. However, if many fine irregularities are present on the base plate, a gap is formed between the base plate and the heat-dissipation fin, and even if a heat-dissipation grease having high thermal conductivity is applied, thermal conductivity is significantly decreased. As a result, there has been a problem that heat dissipation property of entire module constituted by the ceramic circuit substrate, the base plate and the heat-dissipation fin, etc. is significantly decreased.

To cope with this problem, in order to reduce such a gap between the base plate and the heat-dissipation fin as much as possible, a base plate formed to have a convex warpage in advance is used. This warpage is obtainable is by applying a pressure to the base plate as it is heated, by using a jig having a predetermined shape. However, since warpage obtained by such a method varies in the warpage amount and shape, and thus there has been a problem that its quality is not consistent. Further, due to the variation of warpage shape or surface irregularities, there has been a problem that a large gap is still formed between the base plate and the heat-dissipation fin.

There is a method of forming a warpage by cutting the base plate surface by machining. However, in this method, since the aluminum-silicon carbide composite is extremely hard, significant amount of grinding by a tool such as a diamond is required, and there has been a problem that its cost is high. To solve the above problem, a method is proposed, in which a flat silicon carbide porous body is impregnated with a metal containing aluminum as the main component, an aluminum alloy layer made of a metal containing aluminum as the main component is formed on each primary plane, and the aluminum alloy layer in the heat dissipation side is mechanically fabricated.

However, in a case of producing a base plate by using this method, when the aluminum alloy layer is mechanically fabricated, it is necessary to fabricate the aluminum alloy layer so that the aluminum-silicon carbide composite is not exposed to the outside. For this reason, considering warpage or distortion of the base plate itself and variation of its fabrication, the thickness of aluminum alloy layer to be formed on each primary plane needs to be inevitably thick, and for this reason, the thermal expansion coefficient of the base plate itself increases, and when it is soldered with a ceramic circuit substrate at a time of assembling a power module, there has been a case where a recess is formed on a heat dissipation plane of the ceramic circuit substrate.

Further, in this method, since it is necessary to control the thickness of the aluminum alloy layer on each primary plane to have uniform thickness and not to make the aluminum-silicon carbide composite exposed to the outside, there has been a problem that high degree of fabrication technique is required.

Patent Document 1: JP-A-5-507030

DISCLOSURE OF THE INVENTION

Problems to be Solved by the Invention

The present invention has been made considering the above circumstances, and it is an object of the present invention to provide an aluminum-silicon carbide composite suitable as a base plate for power module.

Means for Solving the Problems

The present inventors have conducted extensive studies to achieve the above object, and as a result, they have discovered that in an aluminum-silicon carbide composite that is a flat silicon carbide porous body impregnated with a metal containing aluminum as the main component, plating to the composite is possible by providing an aluminum layer made of an aluminum alloy on one primary plane (front surface), and its flatness can be improved by grinding an aluminum layer on the rear side to make the aluminum-silicon carbide composite exposed to the outside. Further, the inventors have discovered that by controlling the thickness of aluminum layer, the warpage shape after the aluminum layer on the rear side is ground can be controlled, to complete the present invention.

Namely, the present invention provides a base plate for power module, comprising an aluminum-silicon carbide composite that is a flat plate-shaped silicon carbide porous body impregnated with a metal (hereinafter referred to as aluminum alloy) containing aluminum as the main component, and an aluminum layer made of a metal containing aluminum as the main component formed only on one of the principal planes of the composite, wherein a rear surface being the other one of principal planes of the aluminum-silicon carbide composite is exposed to the outside, and the shape of the exposed aluminum-silicon carbide composite is a rectangle or a rectangle from which portions encompassing holes in the peripheral portion are removed.

Further, the present invention provides the base plate for power module, wherein the peripheral portion or the peripheral portion and portions surrounding holes are made of metal layer containing aluminum as the main component, or a composite of ceramic fiber, ceramic particles and a metal containing aluminum as the main component; or the base plate for power module, wherein the aluminum-silicon carbide composite is exposed in the peripheral portion of the base plate.

Further, the present invention provides the base plate for power module, wherein the warpage of the rear surface is from 0 to 200 μm per 10 cm length; the base plate for power module, wherein the depth of recess in the rear surface is at most 50 μm; the base plate for power module, wherein the average thickness of the aluminum layer is from 1 to 500 μm; or the base plate for power module, wherein the average thickness of the aluminum layer is from 1 to 100 μm, and the difference between the maximum thickness and minimum thickness of the aluminum layer is at most 80 μm.

Further, the present invention provides the base plate for power module, which has a thermal conductivity of at least 180 W/mK and a thermal expansion coefficient of at most $10 \times 10^{-6}$/K; the base plate for power module, wherein the aluminum-silicon carbide composite is produced by a high-pressure forging method; or a heat dissipation device comprising the base plate for power module, a Ni film of from 1 to 20 μm thick formed on the base plate for power module by a Ni-plating treatment, and a ceramic substrate for mounting a semiconductor, bonded to the base plate on which the Ni film is formed.

Effects of the Invention

The aluminum-silicon carbide composite of the present invention has characteristics that are low thermal expansion and high thermal conduction. By grinding one principal plane (rear surface) of a flat aluminum-silicon carbide composite impregnated with an aluminum alloy, it is possible to significantly improve the flatness of the ground surface to be used as a heat dissipation surface, whereby as compared with a conventional method of attaching a ceramic circuit substrate to a warped plane, heat dissipation property after the composite is soldered with a ceramic circuit substrate is improved, and accordingly, the composite is suitable as a base plate for power module for mounting a semiconductor element, which is required to have high reliability.

EXPLANATION OF NUMERALS

Figure 1:
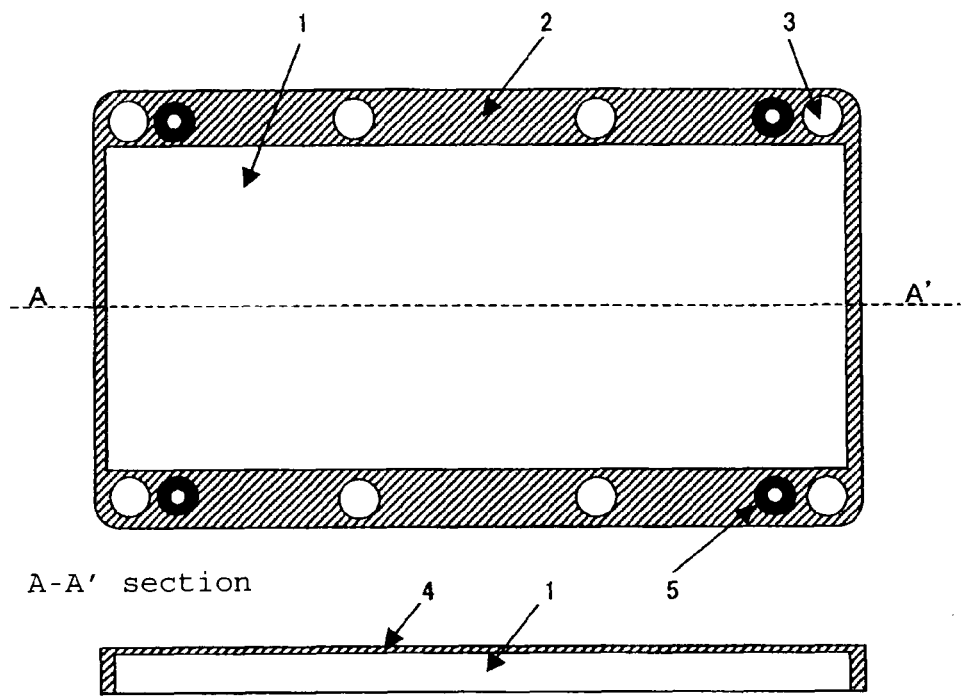
FIG. 1: An explanation view of an aluminum-silicon carbide composite for base plate in an embodiment of the present invention.

1: Aluminum-silicon carbide composite
2: Aluminum alloy
3: Through hole
4: Surface aluminum layer
5: Countersink
6: Threaded hole

BEST MODE FOR CARRYING OUT THE INVENTION

The methods of producing metal-ceramic composite are roughly categorized into two types that are impregnation methods and powder metallurgy method. Among these, metal-ceramic composites having sufficient property in e.g. thermal conduction coefficient are not obtained by powder metallurgy methods, and commercially available metal-ceramic composites are produced by impregnation methods. There are many types of impregnation methods including methods of carrying out impregnation under a normal pressure and methods of carrying out impregnation under a high pressure (high-pressure forging method). High-pressure forging methods are categorized into molten-metal forging methods and die cast methods.

The method suitable for the present invention is a high-pressure forging method of carrying out impregnation under a high pressure, both of molten-metal forging method and die cast method can be used but molten-metal forging method is preferred. A high pressure forging method is a method of putting a ceramic porous body (hereinafter referred to as preform) in a high-pressure container, and making molten aluminum alloy impregnated into the preform under high temperature and high pressure environment to obtain a composite.

Now, an example of method for producing the metal-ceramic composite of the present invention by using a molten-metal forging method is described. A silicon carbide powder (a binder such as a silica is added as the case requires) as a raw material is formed and baked to produce a preform. The method of forming a block by laminating such a preform is not particularly limited, and for example, the following methods are mentioned. Namely, they are a method of sandwiching the preform by mold separation plates on which a mold-separation agent is applied, and laminating them to form a single block; a method of disposing a fiber and spherical or fragmented particles containing alumina or silica as the main component on one side or both sides of the preform so as to be directly in contact with the preform, and sandwiching them by mold separation plates to form a single block; and a method of disposing a fiber and/or spherical or fragmented particles containing alumina or silica as the main component on one side or both sides of the preform so as to be directly in contact with the preform at a time of putting the preform into a mold frame, putting them in the mold frame, sandwiching them by mold separation plates and laminating them to form a single block.

Then, one or two or more pieces of the above blocks that are preliminary heated at about from 500 to 750° C. are disposed in a high pressure container, molten aluminum alloy is poured into the container as quickly as possible to prevent temperature drop of the blocks, they are pressurized at a pressure of 30 MPa or more so that the aluminum alloy is impregnated into pores in the preforms, whereby aluminum-silicon carbide composites each provided with aluminum layers on both of primary planes, are obtained. Here, for the purpose of removing distortion formed at the time of impregnation, an annealing treatment of the impregnated product may be carried out.

The aluminum alloy in the aluminum-silicon carbide composite of the present invention, preferably has a low melting point as much as possible to be sufficiently penetrated into pores in the preform at the time of impregnation. As such an aluminum alloy, an aluminum alloy containing from 7 to 25 mass % of silicon may, for example, be mentioned. The aluminum alloy preferably further contains magnesium since it strengthen bond between silicon carbide particles and metal portions. There is no limitation as to metal components other aluminum, silicon and magnesium in the aluminum alloy so long as its property does not extremely change, and for example, it may contain e.g. copper.

In the present invention, in order to form an aluminum layer having a uniform predetermined thickness, it is preferred to form the preform or to fabricate a face of a baked product of the preform so that its thickness variation in the entire region is at most 150 μm, preferably at most 50 μm. If the thickness variation in the entire region of preform exceeds 150 μm, the thickness variation of an aluminum layer formed on the front surface of an aluminum-silicon carbide composite obtained becomes large, such being not preferred.

The above preform is preferably laminated with mold-separation plates each applied with a mold-separation agent that are sandwiching the preform, or the preform is preferably laminated with formed product(s) containing from 60 to 95 mass % of fiber and from 40 to 5 mass % of spherical or fragment-shaped particles made of alumina or silica as the main component, and the mold-separation plates so that the formed product is sandwiched between one or each surface of the preform and the mold-separation plate. By thus disposing the formed product in advance, there is a merit that an aluminum layer of predetermined thickness can be formed on a surface of preform and the thickness of the aluminum layer can be easily controlled. When the content of the spherical or fragment-shaped particles in the formed product is less than 5 mass %, control of the thickness of aluminum layer on each primary plane becomes difficult, and warped shape of the preform may be drastically changed by an annealing treatment after the aluminum layer on one of the primary planes is subjected to a cutting treatment, in some cases. On the other hand, if the content of particles exceeds 40 mass %, the preform may be cracked by a pressure at the time of impregnation.

The annealing treatment for the purpose of removing distortion at a time of impregnating the aluminum alloy into the preform, is preferably carried out at a temperature of from 400 to 550° C. for at least 10 minutes. If the annealing temperature is less than 400° C., the distortion in the complex is not sufficiently released, and the warpage of the complex may drastically change in the annealing process after a machining process. On the other hand, if the annealing temperature exceeds 550° C., the impregnated aluminum alloy may melt. If the annealing time is less than 10 minutes, even at an annealing temperature of from 400 to 550° C., the distortion in the complex is not sufficiently released, and its warpage may drastically change in the annealing treatment for removing distortion formed by a grinding treatment.

There is no particular limitation as to the method for producing the formed product of porous silicon carbide (hereinafter referred to as SiC preform) according to the present invention, and the SiC preform can be produced by a known method. For example, it is obtainable by adding to a silicon carbide powder e.g. a silica or an alumina as a binder, mixing and forming them and baking them at least 800° C. There is no limitation as to the forming method, and e.g. press-molding, extrusion molding or casting may be used. In the forming step, a binder for maintaining shape may be used in combination as the case requires.

Particularly important characteristics of the aluminum-silicon carbide composite is thermal conductivity and thermal expansion coefficient. As the content of silicon carbide (SiC) in the aluminum-silicon carbide composite increases, the thermal conductivity increases and the thermal expansion coefficient decreases, and thus, the SiC content is preferably high. However, if the SiC content is too high, impregnation control of the aluminum alloy becomes difficult. Practically, the composite preferably contains at least 40 mass % of coarse SiC particles having a particle size of at least 40 μm, and the relative density of the SiC preform is preferably within a range of from 55 to 75%. Further, the SiC preform preferably has a strength of at least 3 MPa in terms of bending strength, in order to avoid breakage of the preform at a time of handling or impregnation.

Particle size of the raw material SiC particles for producing the SiC preform is preferably adjusted. This is because it is difficult for a SiC preform made only of coarse particles to exhibit high strength, and it is not possible to expect high thermal conductivity of aluminum-silicon carbide composite made only of fine particles. According to the study of the present inventors, for example, a mixed powder containing from 40 to 80 mass % of silicon carbide coarse particles having a particle size of at least 40 μm and from 60 to 20 mass % of silicon carbide fine particles having a particle size of at most 15 μm, is preferred.

The SiC preform is obtained by degreasing and baking a formed product of silicon carbide particles. When the baking temperature is at least 800° C., a preform having a bending strength of at least 3 MPa is obtained regardless of the atmosphere at the time of baking. In an oxidizing atmosphere, if the formed product is baked at a temperature exceeding 1,100° C., oxidation of silicon carbide is promoted, and there is a possibility that the thermal conductivity of the aluminum-silicon carbide composite decreases. For this reason, it is preferred to bake the formed product at a temperature of at most 1,100° C. in a case of oxidizing atmosphere. Baking time is appropriately determined according to the conditions such as the size of SiC preform, the amount of the formed product put in a baking furnace or the baking atmosphere.

When the SiC preform according to the present invention is formed into a predetermined shape, by drying one SiC preform each time or by drying SiC preforms as they are overlaid with a spacer made of e.g. carbon interposed between them, it is possible to prevent change of the warped shape by the drying. Further, also in the baking step, by carrying out a similar treatment to the treatment in the drying step, it is possible to prevent change of the shape of SiC preform due to the change of internal texture.

Figure 2:
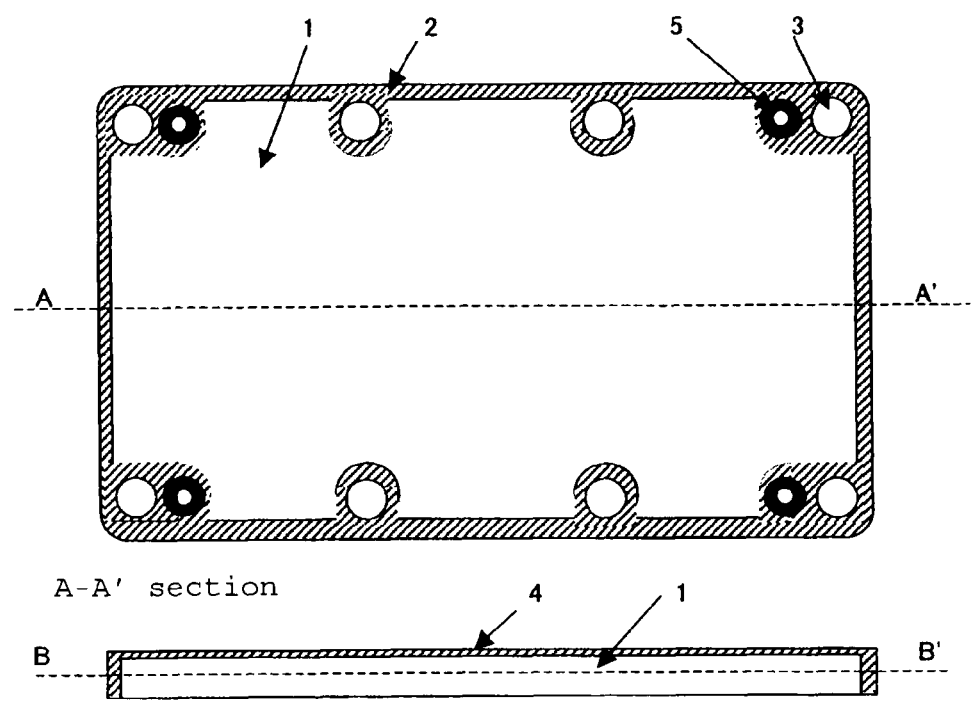
FIG. 2: An explanation view of an aluminum-silicon carbide composite for base plate in an embodiment of the present invention.
Figure 3:
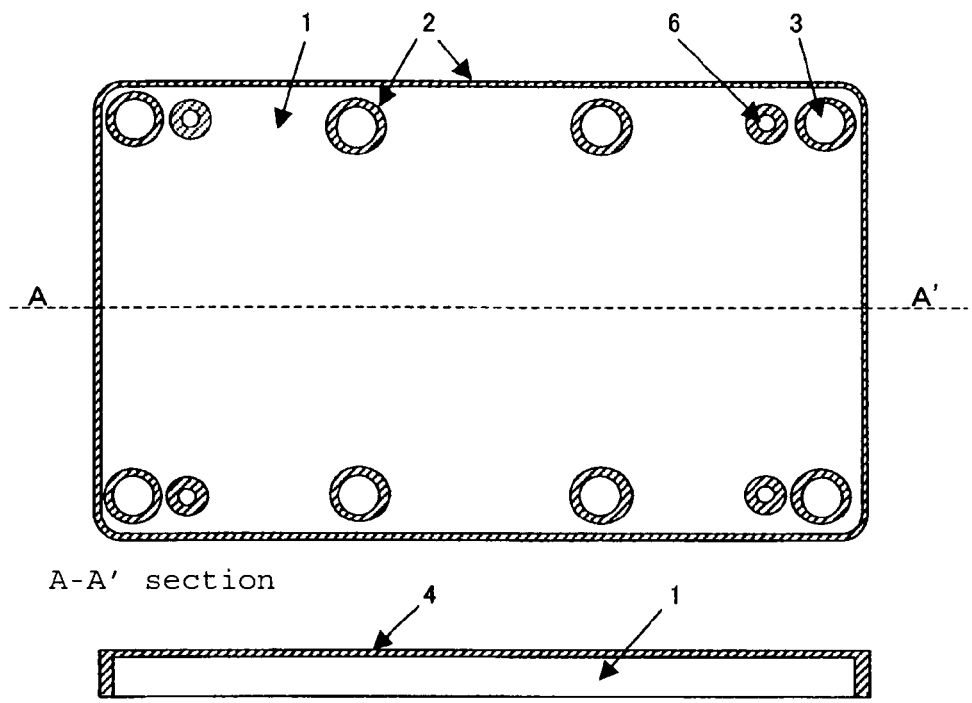
FIG. 3: An explanation view of an aluminum-silicon carbide composite for base plate in an embodiment of the present invention.

The shape of SiC preform is preferably a flat-plate shape of rectangle (refer to FIG. 1) or a rectangle from which portions encompassing holes in the peripheral portion (refer to FIGS. 2 and 3). It is necessary that is the peripheral portion of the aluminum-silicon carbide composite of the present invention has a predetermined shape or e.g. holes for attachment are formed on the peripheral portion in order to use the composite as a base plate for power module after it forms a composite. In this case, since the aluminum-silicon carbide composite is extremely hard, and large amount of grinding by using a tool of e.g. a diamond is required, there is a problem that its cost becomes high. Accordingly, in order to make it easily machined, it is preferred that the portion to be machined is made of an aluminum alloy or a composite of easily workable material comprising ceramic fiber, ceramic particles and an aluminum alloy, in advance.

The area of SiC preform in the entire region of base plate, is not particularly limited so long as it covers a portion to be joined with a ceramic circuit substrate, and it is preferably at least 70% based on the area of base plate. By using an aluminum-silicon carbide composite for a portion to be joined with a ceramic circuit substrate, it is possible to reduce the thermal expansion difference between these members and to improve reliability of the joined portion. If the area of SiC preform is less than 70% of the area of base plate, the thermal expansion coefficient of the obtained base plate itself becomes too large, and there is a possibility that the reliability of warped shape or reliability of joined portion decreases.

Then, an example of machining method of the aluminum-silicon carbide composite obtained will be described. The peripheral portion and holes of the aluminum-silicon carbide composite of the present invention can be easily machined by using an apparatus such as an NC lathe or a machining center. Further, with respect to surface machining of the above composite, it is possible to apply a grinding treatment by using e.g. a surface grinder or a belt grinder so that the aluminum-silicon carbide composite is exposed to the outside. Further, it is also possible to cut the composite to have an optional warped shape by e.g. a lathe, so as to finish it to have a spherical shape.

Figure 4:
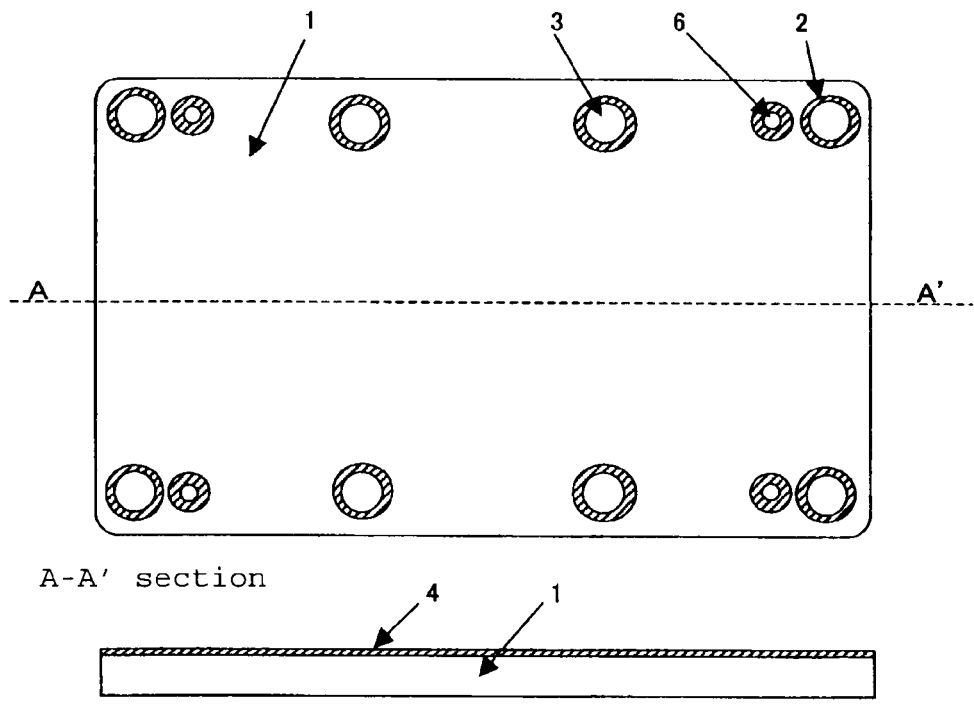
FIG. 4: An explanation view of an aluminum-silicon carbide composite for base plate in an embodiment of the present invention.
Figure 5:
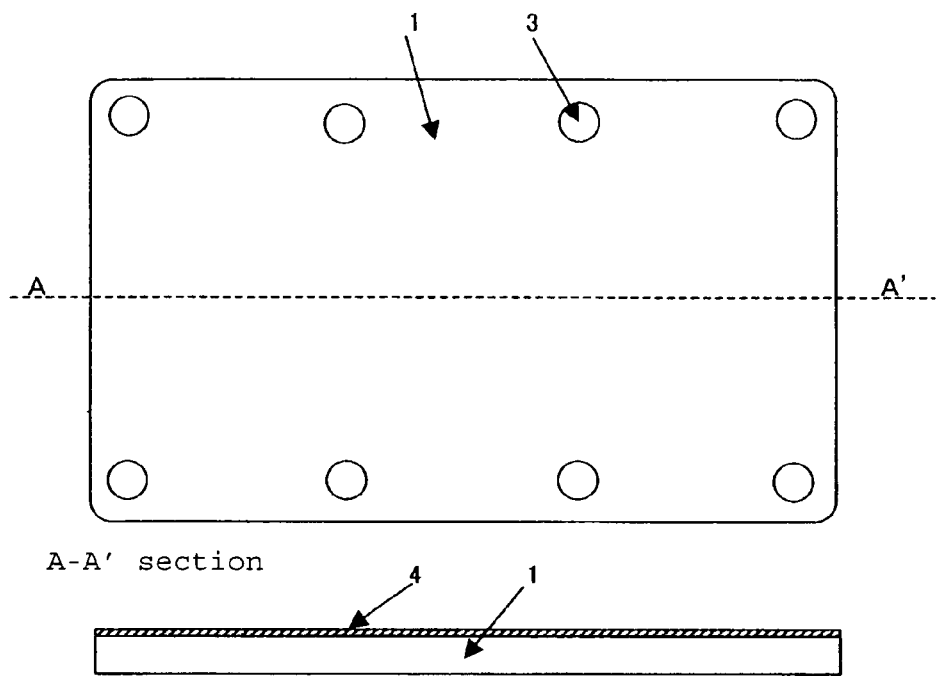
FIG. 5: An explanation view of an aluminum-silicon carbide composite for base plate in an embodiment of the present invention.

After the aluminum-silicon carbide composite is produced by using the above SiC preform, it is also possible to machine the peripheral portion or the peripheral portion and the holes by using e.g. a water jet machining machine or an electric discharge machine so that the aluminum-silicon carbide composite is exposed from the side face of the peripheral portion of the base plate (refer to FIG. 4). Further, after an aluminum-silicon carbide composite is produced by using a SiC preform having an area larger than that of the base plate, it is also possible to form the peripheral portion or the holes of the base plate by the above machining method, so that the aluminum-silicon carbide composite is exposed from side faces of both of the peripheral portion and the holes (refer to FIG. 5). Further, the faces of the machined product obtained is further machined by e.g. a surface grinding machine or a belt grinding machine, to produce a base plate for power module of the present invention.

The aluminum-silicon carbide composite machined is subjected to an annealing treatment at a temperature of from 300 to 500° C. for at least 10 minutes to have a warpage. The aluminum-silicon carbide composite of the present invention has an aluminum layer on one principal plane (front surface), and by subjecting the composite to the above annealing treatment, a warpage is produced by the thermal expansion difference between the aluminum layer and the aluminum-silicon carbide composite. If the annealing temperature is less than 300° C., the distortion of the aluminum layer and the composite is not sufficiently released, and the warpage may change in a subsequent heat treatment process such as a soldering step. On the other hand, if the annealing temperature exceeds 550° C., the aluminum alloy employed in the impregnation may melt. If the annealing time is less than 10 minutes, the distortion of the aluminum alloy and the composite is not sufficiently released even if the annealing temperature is from 300 to 550° C., and there is a risk that the warpage may change in a subsequent heat treatment step such as soldering. The warped shape formed by the annealing treatment becomes a warped shape close to an ideal spherical shape (refer to FIG. 6) since it is produced by the thermal expansion difference between the aluminum layer and the aluminum-silicon carbide composite.

The warpage amount of the exposed ground surface (rear surface) of the aluminum-silicon carbide composite after the annealing treatment, is preferably from 0 to 200 μm per 10 cm length. When the composite is used as a base plate for power module, and if the ground surface that is used as a heat radiation surface has a concave warpage, a gap is formed between the base plate and a heat radiation fin in the subsequent module assembly step, and even if a heat radiation grease having high thermal conductivity is applied to the gap, the thermal conductivity significantly decreases. As a result, there is a case where the heat dissipation property of a module constituted by the ceramic circuit substrate, the base plate and the heat-dissipation fin, etc. significantly decreases. Further, if the warpage amount exceeds 200 μm, at a time of screwing the composite to the heat dissipation fin to join them, there is a case where a crack is formed in the base plate or the ceramic circuit substrate.

By grinding the heat dissipation plane, it is possible to make the heat dissipation plane of the composite to have a shape having little irregularities and having a recess of at most 50 μm deep. If the depth of recess in the heat dissipation plane exceeds 50 μm, and when the composite is used as a base plate for power module, a gap is formed between the base plate and the heat dissipation fin in the subsequent module assembly step, and even if a heat dissipation grease of high thermal conductivity is applied to the gap, the thermal conductivity drastically decreases. As a result, there is a case where the heat dissipation property of a module constituted by the ceramic circuit substrate, the base plate and the heat dissipation fin etc. significantly decreases. Here, the above depth of recess means its maximum value.

The warpage amount of the circuit substrate face is preferably from −100 to 100 μm per 10 cm. If the warpage of the circuit substrate face deviates from the above range, the solder thickness at the time of joining it with the circuit substrate can not be uniform, and a void is likely to occur at a time of soldering, whereby a heat dissipation property of a module constituted by a ceramics circuit substrate, a base plate and a heat dissipation fin etc., may drastically decrease.

The thickness of the aluminum layer (hereinafter it is also referred to as surface aluminum layer) provided on the surface of the aluminum-silicon carbide composite may be any thickness so long as it is within a range not causing a problem at a time of grinding a heat dissipation side surface, and the average thickness is preferably from 1 to 500 μm. The thickness of the surface aluminum layer can be adjusted to be a predetermined thickness by machining the surface of the composite by means of e.g. a lathe. The surface aluminum layer is necessary to secure the plating adhesiveness at a time of applying a plating treatment. If its average thickness is less than 1 μm, there may occur such a problem that the aluminum-silicon carbide composite is partially exposed at a time of subsequent surface treatment such as pretreatment of plating, and the plating is not provided in such a portion or the plating adhesiveness decreases. On the other hand, if its average thickness exceeds 500 μm, the thermal expansion of the base plate itself obtained becomes too large, and there is a case where the reliability of the joint portion decreases or the warpage amount after the annealing treatment becomes too large. The most suitable value of the average thickness of the surface aluminum layer is appropriately determined according to the desired warpage amount and the thickness of the base plate.

In the base plate for power module of the present invention, the average thickness of the surface aluminum layer is preferably from 1 to 100 μm, and the difference between the maximum and the minimum thicknesses is at least 80 μm. When the average thickness is at most 100 μm, the distortion amount produced by the thermal expansion difference between the surface aluminum layer and the aluminum-silicon carbide composite can be reduced, and stability of the warpage shape such as the above heat cycle property, improves. Further, if the difference between the maximum and the minimum thicknesses of the surface aluminum layer exceeds 80 μm, e.g. waving due to the difference of the thickness of the surface aluminum layer may be generated to cause uneven thickness of solder at a time of soldering e.g. a ceramic circuit substrate, whereby the heat dissipation property may decrease.

The base plate for power module of the present invention is excellent in shape stability when it is subjected to a heat cycle test (a sample is maintained at a temperature difference between −50° C. to 150° C.), that is a yardstick of reliability of power module, and for example, the change amount of warpage of the base plate after the heat cycle test of the above conditions is carried out 300 times, is at most 30 μm per 10 cm length. If the warpage change amount exceeds 30 μm per 10 cm length, a gap is formed between the base plate and the heat dissipation fin in the power module assembly step, and even if a heat dissipation grease having high thermal conductivity is applied to the gap portion, the thermal conductivity significantly may decrease.

The aluminum-silicon carbide composite according to the present invention has stress easing property as well as good heat dissipation property, and for example, it is suitable as a base plate to be interposed between a ceramic circuit substrate and a heat dissipation component such as a heat dissipation fin.

The aluminum-silicon carbide composite according to the present invention is employed as it is joined with a ceramic circuit substrate by soldering when the composite is used as a base plate for power module. For this reason, a Ni plating needs to be applied to the surface of base plate. The plating treatment method is not particularly limited, and it may be any one of electroless plating treatment or an electroplating treatment. The thickness of Ni plating is preferably from 1 to 20 μm. If the plating thickness is less than 1 μm, pinholes may be formed in a part of the plated film, or a soldering void (pore) may be formed at a time of soldering, which deteriorates heat dissipation property from a circuit substrate, such being not preferred. On the other hand, if the thickness of Ni plating exceeds 20 μm, the plated film may be peeled off by the heat expansion difference between the Ni plating film and the surface aluminum layer. In terms of the purity of Ni plating film, there is no limitation so long as it does not deteriorate wet property for solder, and the film may contain e.g. phosphorus or boron.

The aluminum-silicon carbide composite of the present invention preferably has a thermal conductivity of at least 180 W/mK and a thermal expansion coefficient of at most $10 \times 10^{-6}$/K. Besides the above effects, the composite has high thermal conductivity and a low thermal expansion coefficient equivalent to that of a semiconductor component or a ceramic circuit substrate, whereby a heat dissipation component employing such a composite or a power module employing such a heat dissipation component is excellent in heat dissipation property and there is also a merit that it is hardly deformed even if its temperature is changed, and as a result, high reliability is obtained.

EXAMPLES

Example 1 to 4

210 g of silicon carbide particles A (manufactured by Pacific Rundum Co., Ltd.: NG-220, average particle size: 60 μm), 90 g of silicon carbide particles B (manufactured by Yakushima Denko Co., Ltd.: GC-1000F, average particle size: 10 μm) and 30 g of silica sol (manufactured by Nissan Chemical Industries, Ltd.: Snowtex) were weighed, and they were blended for 30 minutes by a stirring mixer, and press-molded at a pressure of 10 MPa into a flat plate shape of 190 mm×140 mm×5.8 mm size.

The formed product obtained was dried at a temperature of 120° C. for 2 hours, and baked in an environmental air at a temperature of 900° C. for 2 hours to obtain a SiC preform having a relative density of 65%. Surfaces of the SiC preform obtained were machined to have a thickness shown in Table 1 by a surface grinder employing a grinding stone made of diamond, and its outer peripheral portion is machined into a shape indicated by 1 of FIG. 2 by a machining center. Here, FIG. 2 is a view schematically showing a lateral cross section (B-B' section of A-A cross section) of the aluminum-silicon carbide composite. FIG. 1 and FIGS. 3 to 5 show the same manner.

TABLE 1

| | Thickness (mm) | External dimension (mm) | | Shape | Lamination condition *1 | |
|---|---|---|---|---|---|---|
| | | Long side | Short side | | A surface | B surface |
| Ex. 1 | 5.45 | 183 | 133 | Shape shown in FIG. 2 | None | None |
| Ex. 2 | 5.3 | 183 | 133 | Shape shown in FIG. 2 | None | 1 |
| Ex. 3 | 5.1 | 183 | 133 | Shape shown in FIG. 2 | None | 2 |
| Ex. 4 | 5.1 | 183 | 133 | Shape shown in FIG. 2 | 1 | 1 |

* Lamination condition: The number of alumina fibers of 180 × 130 × 0.2 mm

The SiC preform obtained was put in an iron frame of 185×135×5.5 mm provided with a molten metal inlet port through which a molten metal can be poured, and at this time, for a SiC preform of each of Examples 2, 3 and 4, an alumina fiber (manufactured by Tanaka Seishi Co., purity: 97%) of 180×130×0.2 mm was laminated to at least one of A surface and B surface, and they were accommodated in the iron frame, they were sandwiched by stainless plates both surface of which were coated with carbon, and they were preliminary heated at 600° C. in an electric furnace. Subsequently, they were accommodated in a preliminary heated press mold having an inner diameter of 300 mm, a molten aluminum alloy containing 12 mass % of silicon and 0.5 mass % of magnesium, was poured and they were pressurized under a pressure of 100 MPa for 20 minutes so that the aluminum alloy was impregnated into the SiC preform. They were cooled to a room temperature, and e.g. iron frame was cut by using a wet type band saw, the sandwiching stainless plates were removed, and an annealing treatment was carried out at a temperature of 530° C. for 3 hours to remove distortion caused by the impregnation, to obtain an aluminum-silicon carbide composite.

In the peripheral portion of the aluminum-silicon carbide composite obtained, 8 through holes of 7 mm in diameter and 4 countersinks of from 10 to 4 mm in diameter were formed, a portion corresponding to the molten metal inlet was removed, and one surface (A surface of Table 1) was ground to remove 0.5 mm by a surface grinder by using a grinding stone made of diamond, so that the composite had a shape of 185×135×5 mm. FIG. 2 shows the aluminum-silicon carbide composite thus obtained. In FIG. 2, 1 indicates the aluminum-silicon carbide composite, 2 indicates an aluminum alloy, 3 indicates a through hole, 4 indicates a surface aluminum layer and 5 indicates a countersink.

Then, the machined product obtained was subjected to an annealing treatment in an electric furnace at a temperature of 530° C. for 1 hour to remove distortion caused by machining. Subsequently, it was subjected to a blast treatment under a pressure of 0.4 MPa and a feeding speed of 1.0 m/min with alumina abrasive particles, to be cleaned, and it was subjected to electroless Ni—P and Ni—B platings. By this process, a plated layer of 8 μm thick (Ni—P: 6 μm+Ni—B: 2 μm) was formed on the surface of the composite.

Figure 6:
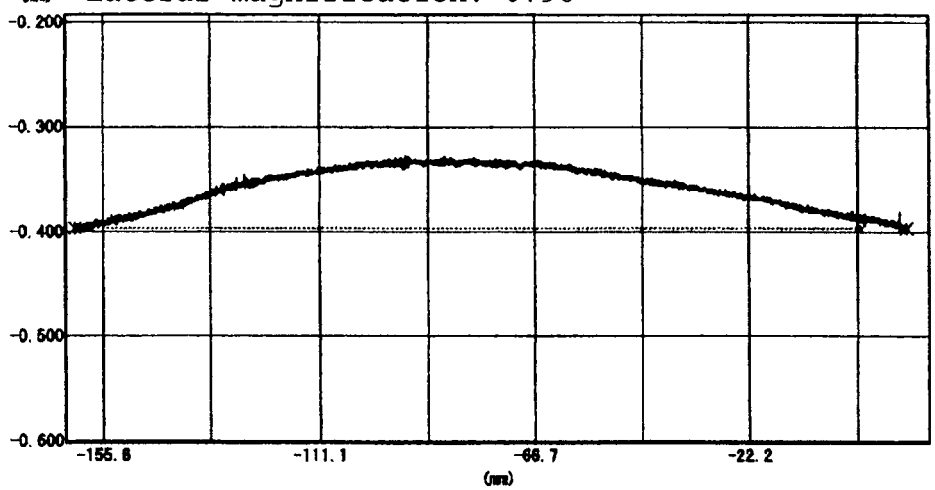
FIG. 6: A graph showing the measurement result of warped shape by a profile measurement tool of Example 1.

Each sample of the aluminum-silicon carbide composite obtained was cut along its diagonal line by machining and the thickness of aluminum layer on one principal plane exposed by the cutting was measured at 20 points at constant intervals along the diagonal line, and its average thickness was calculated. Further, a test piece for thermal expansion coefficient measurement (3 mm in diameter, 10 mm long) and a test piece for thermal conductivity measurement (11 mm in diameter, 3 mm thick) were produced from each sample. By using these test pieces, the thermal expansion coefficient from 25 to 250° C. was measured by using a thermal expansion meter (manufactured by Seiko Instruments Inc., TMA300) and the thermal conductivity at 25° C. was measured by a laser flash method (manufactured by Rigaku Corporation: LF/TCM-8510B). With respect to the warped shape, using a contour measurement instrument (manufactured by TOKYO SEIMITSU CO., LTD.: contour cord 1600D-22), the warped amount per 10 cm length and recess depth of each sample were measured. Table 2 shows the results. Further, FIG. 6 shows the warped shape measurement results of Example 1 by the contour measurement instrument.

TABLE 2

| | Thermal conductivity (W/mK) | Thermal expansion coefficient (ppm/K) | Al layer thickness (μm) | | Warpage amount (μm) *3 | Recess depth (μm) |
| --- | --- | --- | --- | --- | --- | --- |
| | | | Average | Range *2 | | |
| Ex. 1 | 210 | 7.3 | 40 | 30 | 42 | 5 |
| Ex. 2 | 210 | 7.4 | 210 | 60 | 110 | 10 |
| Ex. 3 | 210 | 7.5 | 400 | 75 | 175 | 15 |
| Ex. 4 | 210 | 7.3 | 180 | 55 | 105 | 10 |

*2: Range = the difference between the maximum and the minimum
*3: Warpage amount per 10 cm length at the center in the long side direction of ground surface (A surface) The aluminum layer thickness was measured at non-ground surface (B surface).

By using the plated product of Example 1, a heat cycle test of 300 cycles in a temperature range of from −40° C. to 150° C., was carried out. The warpage amount per 10 cm length after the heat cycle test of Example 1 was 45 μm.

Examples 5 and 6

A SiC preform having a relative density of 66% was obtained in the same manner as Example 1 except that 195 g of silicon carbide particles C (manufactured by Pacific Rundum Co., Ltd.: NG-150, average particle size: 100 μm), 105 g of silicon carbide particles B (manufactured by Yakushima Denko Co., Ltd.: GC-1000F, average particle size: 10 μm) and 30 g of silica sol (manufactured by Nissan Chemical Industries, Ltd.: Snowtex) as raw materials. A surface of the SiC preform obtained was ground by a surface grinding machine by using a grinding stone made of diamond so that the sample has a thickness shown in Table 3, and the peripheral portion and holes were machined to have the shape indicated by 1 in FIG. 3.

TABLE 3

| | Thickness (mm) | External dimension (mm) | | Shape | Lamination condition *1 | |
| --- | --- | --- | --- | --- | --- | --- |
| | | Long side | Short side | | A surface | B surface |
| Ex. 5 | 5.5 | 183 | 133 | Shape shown in FIG. 2 | None | None |
| Ex. 6 | 5.3 | 183 | 133 | Shape shown in FIG. 2 | None | 1 |

* Lamination condition: The number of alumina fibers of 180 × 130 × 0.2 mm

On one surface (B surface) of the SiC preform obtained in Example 6, an alumina fiber (manufactured by Tanaka Seishi Co., purity: 97%) of 180×130×0.2 mm was provided, they were sandwiched by stainless plates both surfaces of which were coated with carbon, and they were preliminary heated at 600° C. in an electric furnace. Subsequently, they were accommodated in a preliminary heated press mold having an inner diameter of 300 mm, a molten aluminum alloy containing 12 mass % of silicon and 0.5 mass % of magnesium, was poured and they were pressurized under a pressure of 100 MPa for 20 minutes so that the aluminum alloy was impregnated into the SiC preform. They were cooled to a room temperature, the sandwiching stainless plates were removed, and SiC preform was annealed at a temperature of 530° C. for 3 hours to remove distortion caused by the impregnation, to obtain an aluminum-silicon carbide composite.

One surface (A surface of Table 3) of the aluminum-silicon carbide composite obtained was ground to remove 0.5 mm by a surface grinding machine by using a grinding stone made of diamond, and as shown in FIG. 3, 8 through holes of 7 mm in diameter and 3 or 4 countersinks 6 of 4 mm in diameter were formed in the peripheral portion, and the circumference of the composite was machined to have a dimension of 187×137 mm (corner portions were each R7 mm). Then, in order to remove distortion caused by the machining, an annealing treatment was carried out in an electric furnace at a temperature of 530° C. for 1 hour. Subsequently, the composite was subjected to a blast treatment under a pressure of 0.4 MPa and a feeding speed of 1.0 m/min with alumina abrasive particles, to be cleaned, and thereafter, subjected to electroless Ni—P and Ni—B platings, to form a plating layer of 8 μm thick (Ni—P: 6 μm+Ni—B: 2 μm) on the surface of the composite. With respect to the composite obtained, an evaluation was carried out in the same manner as Example 1. Table 4 shows the results.

TABLE 4

| | Thermal conductivity (W/mK) | Thermal expansion coefficient (ppm/K) | Al layer thickness (μm) | | Warpage amount (μm) *3 | Recess depth (μm) |
| --- | --- | --- | --- | --- | --- | --- |
| | | | Average | Range *2 | | |
| Ex. 5 | 210 | 7.2 | 5 | 6 | 25 | 3 |
| Ex. 6 | 210 | 7.3 | 120 | 20 | 60 | 5 |

*2: Range = the difference between the maximum and the minimum
*3: Warpage amount per 10 cm length at the center in the long side direction of ground surface (A surface) The aluminum layer thickness was measured at non-ground surface (B surface).

Example 7

An aluminum-silicon carbide composite was prepared in the same manner as Example 5 except that the shape of the SiC preform was 190×140×5.3 mm. One surface of the composite obtained was ground by a surface grinding machine by using a grinding stone made of diamond to remove 0.3 mm, and 8 through holes 3 of 7 mm in diameter and 4 countersinks 6 of 4 mm in diameter were formed in the peripheral portion of the composite, and its circumference was machined by a water jet machining machine so that the dimension of the composite became 187×137 mm (corner portions were each R7 mm) (refer to FIG. 4). Then, in order to remove distortion caused by the machining, the composite was subjected to an annealing treatment in an electric furnace at a temperature of 530° C. for 1 hour. Subsequently, the it was subjected to a blast treatment under a pressure of 0.4 MPa and a feeding speed of 1.0 m/min with alumina abrasive particles, so as to be cleaned, and was subjected to electroless Ni—P and Ni—B platings. As a result, a plating layer of 8 μm thick (Ni—P: 6 μm+Ni—B: 2 μm) was formed on the surface of the composite. With respect to the composite obtained, evaluation was made in the same manner as Example 1. Table 5 shows the results.

TABLE 5

| | Thermal conductivity (W/mK) | Thermal expansion coefficient (ppm/K) | Al layer thickness (μm) | | Warpage amount (μm) *3 | Recess depth (μm) |
|---|---|---|---|---|---|---|
| | | | Average | Range *2 | | |
| Ex. 7 | 210 | 7.1 | 6 | 7 | 23 | 3 |

*2: Range = the difference between the maximum and the minimum
*3: Warpage amount per 10 cm length at the center in the long side direction of ground surface (A surface) The aluminum layer thickness was measured at non-ground surface (B surface).

Example 8

An aluminum-silicon carbide composite was prepared in the same manner as Example 5 except that the shape of the SiC preform was 190×140×5.3 mm and holes were not formed. One surface of the composite obtained was ground by a surface grinding machine by using a grinding stone made of diamond to remove 0.3 mm, and thereafter, 8 through holes of 7 mm in diameter were formed and the circumference of the composite was machined so that the size of composite became 187×137 mm (corner portions were each R7 mm) by using a water jet machining machine (refer to FIG. 5). Subsequently, an annealing treatment, a blast treatment and plating treatments were carried out in the same manner as Example 5. With respect to the composite obtained, evaluation was made in the same manner as Example 1. Table 6 shows the results.

TABLE 6

| | Thermal conductivity (W/mK) | Thermal expansion coefficient (ppm/K) | Al layer thickness (μm) | | Warpage amount (μm) *3 | Recess depth (μm) |
|---|---|---|---|---|---|---|
| | | | Average | Range *2 | | |
| Ex. 8 | 215 | 7.2 | 5 | 7 | 25 | 3 |

*2: Range = the difference between the maximum and the minimum
*3: Warpage amount per 10 cm length at the center in the long side direction of ground surface (A surface) The aluminum layer thickness was measured at non-ground surface (B surface).

Example 9

An aluminum-silicon carbide composite was prepared in the same manner as Example 5 except that the shape of SiC preform was changed to 180×110×5.3 mm (refer to FIG. 1), and machining and plating treatments were carried out. With respect to a composite obtained, evaluation was made in the same manner as Example 1, and Table 7 shows the results.

TABLE 7

| | Thermal conductivity (W/mK) | Thermal expansion coefficient (ppm/K) | Al layer thickness (μm) | | Warpage amount (μm) *3 | Recess depth (μm) |
|---|---|---|---|---|---|---|
| | | | Average | Range *2 | | |
| Ex. 9 | 210 | 7.2 | 7 | 8 | 27 | 5 |

*2: Range = the difference between the maximum and the minimum
*3: Warpage amount per 10 cm length at the center in the long side direction of ground surface (A surface) The aluminum layer thickness was measured at non-ground surface (B surface).

Example 10

In order to impart a warpage to the aluminum-silicon carbide composite of Example 1 after forming holes, cutting a portion corresponding to molten metal inlet and surface machining, concave and convex molds made of carbon and having a spherical surface having a curvature radius of 10,000 mm were prepared. The concave and convex molds were attached to a hot press machine, and heated so that the surface temperature of the molds became 510° C. The composite was disposed between the concave and convex molds and was pressed at a pressure of 40 KPa. At this time, a thermocouple was contacted to a side face of the composite to measure the temperature. The composite was pressed for 3 minutes from the points when the temperature of the composite became 500° C., and then, the pressure was released and it was naturally cooled to 50° C. Warpage of the convex face side (ground surface) of the composite obtained was measured, and as a result, the warpage amount per 10 cm length was 140 μm.

Example 11

One surface of the aluminum-silicon carbide composite of Example 1 after forming holes, cutting a portion corresponding to molten metal inlet, was ground by a machining center by using a grinding stone made of diamond into a convex surface having a curvature radius of 15,000 mm. Subsequently, in order to remove distortion caused by the machining, it was subjected to an annealing treatment in an electric furnace at a temperature of 530° C. for 1 hour. A warpage of a convex surface side (ground surface) of the composite obtained was measured, and as a result, the warpage amount per 10 cm length was 120 μm.

Industrial Applicability

The aluminum-silicon carbide composite of the present invention has such characteristics that low thermal expansion and high thermal conductivity, and thus it is usable as a base plate for power module.

The entire disclosure of Japanese Patent Application No. 2006-005475 filed on Jan. 13, 2006 including specification, claims, drawings and summary is incorporated herein by reference in its entirety.

The invention claimed is:

1. A base plate, comprising:
   an aluminum-silicon carbide composite, comprising a front surface plane and a rear surface plane, that is a flat plate-shaped silicon carbide porous body impregnated with a metal comprising aluminum as a main component; and
   an aluminum layer comprising a metal comprising aluminum as a main component formed only on the front surface plane of the composite,
   wherein the rear surface plane of the aluminum-silicon carbide composite is exposed to the outside, and wherein the aluminum-silicon carbide composite, where exposed, is in rectangular form, and
   wherein an average thickness of the aluminum layer is from 1 to 100 μm, and a difference between a maximum thickness and minimum thickness of the aluminum layer is at most 80 μm.

2. The base plate according to claim 1, wherein a peripheral portion of the base plate comprises:
   a metal layer comprising aluminum as a main component; or
   a composite comprising ceramic fiber, ceramic particles, and a metal comprising aluminum as a main component.

3. The base plate according to claim 2, wherein holes are provided in the peripheral portion of the base plate.

4. The base plate according to claim 1, wherein the aluminum-silicon carbide composite is exposed to the outside in a peripheral portion of the base plate.

5. The base plate according to claim 1, having a warpage of the rear surface plane is from 0 to 200 μm per 10 cm length.

6. The base plate according to claim 1, having a depth of recess in the rear surface plane is at most 50 μm.

7. The base plate according to claim 1, which has a thermal conductivity of at least 180 W/mK and a thermal expansion coefficient of at most $10 \times 10^{-6}$/K.

8. The base plate according to claim 1, wherein the aluminum-silicon carbide composite is produced by high-pressure forging.

9. The base plate according to claim 1, wherein the area of the silicon carbide porous body in the plane of base plate is at least 70% of the area of base plate.

10. A heat dissipation device, comprising: the base plate as defined in claim 1;
    a Ni film of from 1 to 20 μm thick formed on the base plate by Ni-plating; and
    a ceramic substrate suitable for mounting a semiconductor, bonded to the base plate on which the Ni film is formed.

11. The base plate according to claim 1, wherein the aluminum layer comprising an aluminum alloy comprises 7-25 mass% of silicon.

12. The base plate according to claim 1, wherein the aluminum-silicon carbide composite comprises at least 40 mass% of coarse SiC particles having a particle size of at least 40 μm.

13. The base plate according to claim 1, wherein a relative density of a SiC preform for the aluminum-silicon carbide composite is within a range of from 55 to 75%.

14. The base plate according to claim 1, wherein a SiC preform for the aluminum-silicon carbide composite has a strength of at least 3 MPa in terms of bending strength.

15. The base plate according to claim 1, having a depth of recess in the rear surface plane is at most 10 μm.

16. The base plate according to claim 1, having a depth of recess in the rear surface plane is at most 5 μm.

17. The base plate according to claim 1, having a warpage of the rear surface plane is from 0 to 42 μm per 10 cm length.

18. The base plate according to claim 1, wherein a peripheral portion of the rectangular form is removed so as to leave a void in the composite layer where there is a hole in the base plate.

* * * * *